United States Patent
Das et al.

(10) Patent No.: US 8,451,574 B2
(45) Date of Patent: May 28, 2013

(54) METHOD AND SYSTEM FOR THROUGH FAULT DETECTION IN ELECTRICAL DEVICES

(75) Inventors: Ratan Das, Wilkes Barre, PA (US); Sethuraman Ganesan, Bangalore (IN); John M. Peterson, Lansdale, PA (US)

(73) Assignee: ABB Technology AG, Zurich (CH)

( * ) Notice: Subject to any disclaimer, the term of this patent is extended or adjusted under 35 U.S.C. 154(b) by 764 days.

(21) Appl. No.: 11/991,124

(22) PCT Filed: Aug. 29, 2006

(86) PCT No.: PCT/US2006/033515
§ 371 (c)(1),
(2), (4) Date: Mar. 23, 2010

(87) PCT Pub. No.: WO2007/027598
PCT Pub. Date: Mar. 8, 2007

(65) Prior Publication Data
US 2010/0208403 A1    Aug. 19, 2010

Related U.S. Application Data

(60) Provisional application No. 60/712,735, filed on Aug. 30, 2005.

(51) Int. Cl.
*H02H 3/00*    (2006.01)
(52) U.S. Cl.
USPC .......................................................... 361/94

(58) Field of Classification Search
None
See application file for complete search history.

(56) References Cited

U.S. PATENT DOCUMENTS

| | | | |
|---|---|---|---|
| 4,795,983 A * | 1/1989 | Crockett et al. | 324/521 |
| 6,341,055 B1 * | 1/2002 | Guzman-Casillas | 361/81 |
| 6,518,767 B1 * | 2/2003 | Roberts et al. | 324/521 |
| 7,425,778 B2 * | 9/2008 | Labuschagne et al. | 307/14 |
| 2007/0070565 A1 * | 3/2007 | Benmouyal et al. | 361/62 |

FOREIGN PATENT DOCUMENTS

| | | |
|---|---|---|
| DE | 102 61 848 | 7/2004 |
| JP | 6054439 | 2/1994 |
| JP | 07184317 | 7/1995 |
| WO | WO 2005/064759 | 7/2005 |
| WO | PCT/US2006/033515 | 8/2006 |

* cited by examiner

*Primary Examiner* — Rexford Barnie
*Assistant Examiner* — Angela Brooks
(74) *Attorney, Agent, or Firm* — Michael M. Rickin (57) ABSTRACT

The present invention is directed to a method and a system for fault detection analysis in a power device which is operatively associated with a differential protection unit. The power device has one input side and one output side through which an input current and an output current flows into and out from it, respectively. Signals representative of the input and output currents are processed in order to verify if an occurring fault is external to the power device. Under a condition of an external fault, the differential protection unit is disabled for a determined interval of time.

15 Claims, 5 Drawing Sheets

METHOD AND SYSTEM FOR THROUGH FAULT DETECTION IN ELECTRICAL DEVICES

CROSS REFERENCE TO RELATED APPLICATION

This application claims the priority of U.S. provisional patent application Ser. No. 60/712,735 filed on Aug. 30, 2005, entitled "A METHOD FOR THROUGH FAULT DETECTION ANALYSIS FOR DETECTING INTERNAL TRANSFORMERS FAULTS" the contents of which are relied upon and incorporated herein by reference in their entirety, and the benefit of priority under 35 U.S.C. 119(e) is hereby claimed.

BACKGROUND OF THE INVENTION

The present invention relates to a method and a system for through fault detection in electrical devices.

Figure 1A:
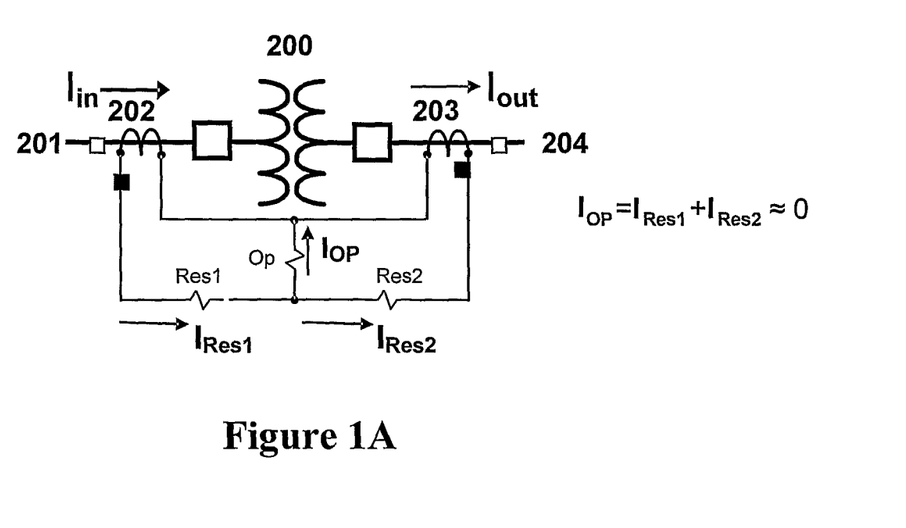
FIG. 1A schematically shows a single phase transformer operating under normal condition.

In many electric devices, such as power transformers, busbars, generators and others, a differential protection technique is used by a protective relaying system, sometimes within an Intelligent Electronic Device (I.E.D.), to determine if the electric device has suffered an internal failure. The electric device is usually positioned along a power line and has a first side connected for example to a power source from which an incoming current flows into the device, and a second side through which a current flows out from the device, for example towards a load. FIG. 1A shows an example of a single phase transformer 200 operating under normal conditions. Located on a first line side 201 there is a first current transformer 202, while a second current transformer 203 is located along a second line side 204. The two current transformers 202 and 203 reduce the high currents on the power line to an appropriate level for processing by a differential protection technique which is usually part of an I.E.D.

The differential protection technique compares the electrical current differential between the source current and the load current. Under normal operating conditions, the magnitude of the differential current also referred to as the operating current ($I_{OP}$) is approximately zero. $I_{RES1}$ and $I_{RES2}$ are the so-called restraining currents, derived from the primary currents. The bold-faced notations, like $I_{OP}$, used for currents herein are for phasor current having a magnitude as well as an angle.

Figure 2:
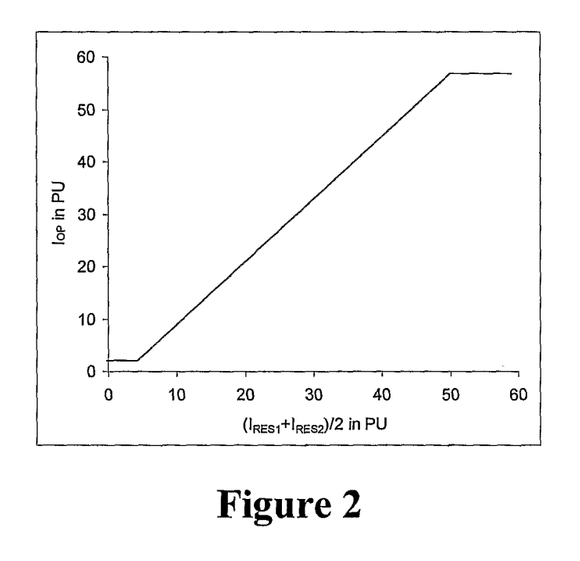
FIG. 2 is a graph representing a typical differential element operating characteristic with multiple slopes used in differential protection units, such as the one used in the power system according to the present invention.

The differential protection technique generally utilizes the relationship between the operating current $I_{OP}$ and the average of the restraining currents $I_{RES1}$ and $I_{RES2}$ and in particular uses the comparative relationship between the operating current ($I_{OP}$) and the average restraining current (($I_{res1}+I_{res2}$)/2) as shown in FIG. 2. Any value for $I_{OP}$ above the characteristic operating curve shown in FIG. 2 indicates that a fault has occurred.

Figure 1B:
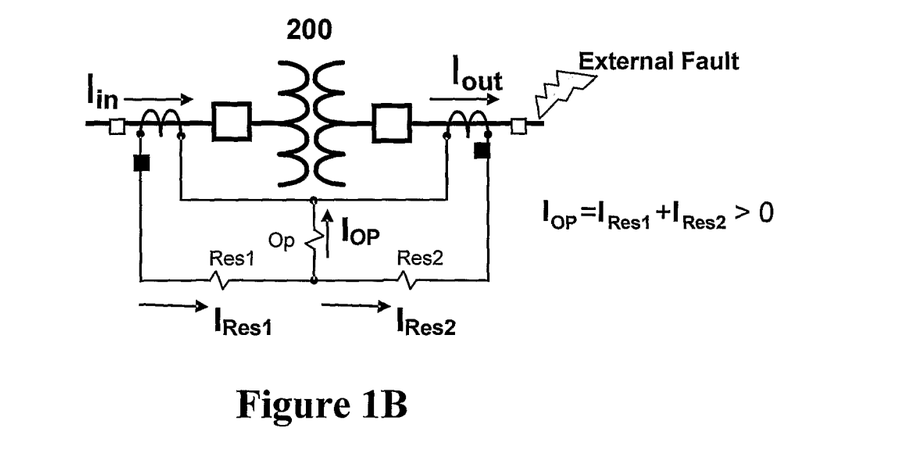
FIG. 1B schematically illustrates a single phase transformer experiencing an external fault.
Figure 1C:
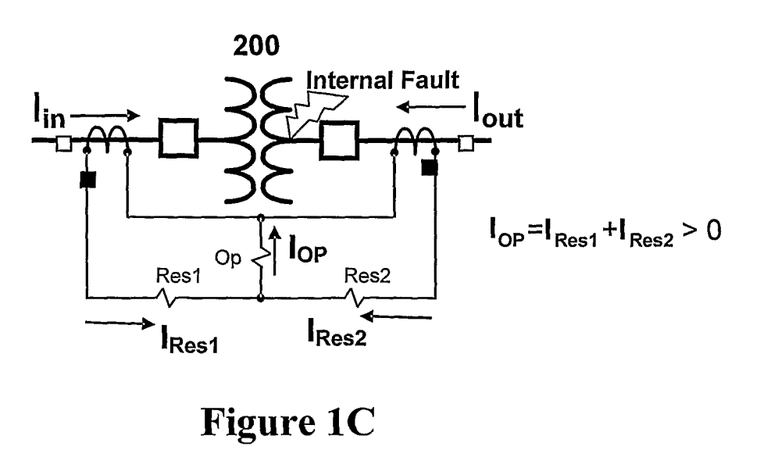
FIG. 1C schematically illustrates a single phase transformer experiencing an internal fault.

The value of the operating current $I_{OP}$ increases when an internal fault condition exists within an electric device but a high operating current can be also the result of external fault conditions which in turn may cause a current transformer to saturate and the operating current $I_{OP}$ to spike. FIG. 1B shows a single phase transformer experiencing an external fault condition. FIG. 1C illustrates a single phase transformer that has experienced an internal fault condition. Similar conditions apply for a three-phase transformer as well.

It is to be understood that internal and external faults are hereby referred to as faults which are located internally or externally with respect to the zone defined by the power device to be protected and the surrounding current transformers associated therewith.

In operation, high operating currents caused by internal fault conditions require intervention of the differential protection unit directly associated with the electric device. On the contrary, external fault conditions which are considered and usually referred to as a "through fault condition" require that no remedial actions be taken on the part of the protective logic directly protecting the device because the fault is not internal to the device.

Thus it is desirable to provide a solution which better discriminates and distinguishes between a high operating current ($I_{OP}$) condition caused by a fault external to the electric device, and a high operating current ($I_{OP}$) condition caused by a fault internal to the electric device.

SUMMARY OF THE INVENTION

A method for fault detection analysis in a power device positioned along a power line having one or more phases which is operatively associated with a differential protection unit, said power device having at least one input side and one output side through which an input current flows into the power device and an output current flows out from the power device, respectively, the method comprising for each of said one or more phases of said power line:

generating a first signal and a second signal which are each representative of said input current flowing on said power line for an associated one of said one or more phases of said power line, and a third signal and a fourth signal which are each representative of said output current flowing on said power line for said one or more phases of said power line for which said first and second signals are generated, wherein said first signal and said second signal are constituted by the magnitude of a first current phasor representing said input current and the change of the magnitude of said first current phasor in a determined period of time, respectively, and wherein said third signal and said fourth signal are constituted by the magnitude of a second current phasor representing said output current and the change of magnitude of said second current phasor in a determined period of time, respectively;

generating a fifth signal and a sixth signal which are each representative of a relationship between said input current flowing on said power line for said associated one of said one or more phases of said power line for which said first and second signals are generated and said output current flowing on said power line for said associated one of said one or more phases of said power line for which said first and second signals are generated, wherein said fifth signal is representative of the phase angle α formed between a first current phasor representing said input current and a second current phasor representing said output current, the first current phasor being taken as reference, and wherein said sixth signal represents the magnitude of a phasor obtained by summing a first current phasor representing said input current and a second current phasor representing said output current;

comparing said first signal and said third signal with a first threshold and said fifth signal with a second threshold expressed in terms of angular values, and when said first signal and said third signal exceed said first threshold and said fifth signal exceeds said second threshold at the same time, producing a first output signal indicative of a potential fault external for said associated one of said one or more phases of said power line for which said first and second signals are generated to the power device;

comparing said second signal and said fourth signal with a third threshold and said sixth signal with a fourth threshold, and when said second signal and said fourth signal exceed said third threshold and said sixth signal exceeds said fourth threshold at the same time, producing a second output signal indicative of a potential fault for said associated one of said one or more phases of said power line for which said first and second signals are generated external to the power device; and when at least one of said first output signal for said associated one of said one or more phases of said power line for which said first and second signals are generated and said second output signal associated with said first output signal indicative of a potential fault external to the power device is still present after a predetermined period of time is elapsed, generating a disabling signal for said associated one of said one or more phases of said power line for which said first and second signals are generated so as to temporarily disable said differential protection unit.

A system for fault detection analysis in a power device positioned along a power line having one or more phases and having at least one input side and one output side through which an input current flows into the device and an output current flows out from the device, respectively, comprising for each of said one or more phases of said power line:

a differential protection unit which is operatively associated with said power device;

means for generating a first signal and a second signal which are each representative of said input current flowing on said power line for an associated one of said one or more phases of said power line, a third signal and a fourth signal which are each representative of said output current flowing on said power line for said associated one or more phases of said power line for which said first and second signals are generated, a fifth signal and a sixth signal which are each representative of a relationship between said input current and said output current flowing on said power line for said associated one or more phases of said power line for which said first and second signals are generated, wherein said first signal and said second signal are constituted by the magnitude of a first current phasor representing said input current and the change of the magnitude of said first current phasor in a determined period of time, respectively, wherein said third signal and said fourth signal are constituted by the magnitude of a second current phasor representing said output current and the change of magnitude of said second current phasor in a determined period of time, respectively, wherein said fifth signal is representative of the phase angle α formed between a first current phasor representing said input current and a second current phasor representing said output current, the first current phasor being taken as reference, and wherein said sixth signal represents the magnitude of a phasor obtained by summing a first current phasor representing said input current and a second current phasor representing said output current;

first comparing means for comparing said first signal and said third signal with a first threshold;

second comparing means for comparing said fifth signal with a second threshold expressed in terms of angular values;

third comparing means for comparing said second signal and said fourth signal with a third threshold;

fourth comparing means for comparing said sixth signal with a fourth threshold;

means for producing for said associated one of said one or more phases of said power line for which said first and second signals are generated a first output signal indicative of a potential fault external to the power device when said first signal and said third signal exceed said first threshold and said fifth signal exceeds said second threshold at the same time, or a second output signal indicative of a potential fault external to the power device when said second signal and said fourth signal exceed said third threshold and said sixth signal exceeds said fourth threshold at the same time; and means for generating for said associated one of said one or more phases of said power line for which said first and second signals are generated a signal temporarily disabling the differential protection unit when at least one of said first output signal and said second output signal indicative of a potential fault external to the power device is still present after a predetermined period of time is elapsed.

BRIEF DESCRIPTION OF THE DRAWINGS

The features, aspects, and advantages of the present invention will become better understood with regard to the following description, appended claims, and accompanying drawings where:

DETAILED DESCRIPTION OF ILLUSTRATIVE EMBODIMENTS

It should be noted that in order to clearly and concisely disclose the present invention, the drawings may not necessarily be to scale and certain features of the invention may be shown in somewhat schematic form.

In the following description and illustrative examples, the method and system according to the present invention are described by making particular reference to their use with electric power transformers without intending in any way to limit its scope and potential field of application with other power devices, such as power lines, reactors, generators, busbars, et cetera. Further, in the appended figures and following description, specific reference will be made to only one electrical phase, e.g. phase A, while all aspect of the method and system of the present invention apply likewise to any other phase might be present.

Figure 3:
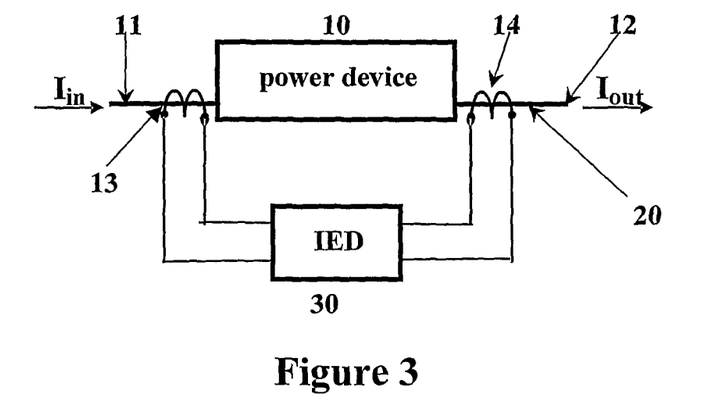
FIG. 3 is a schematic representation of an electrical power device positioned along a power line and connected to a differential protection unit.

FIG. 3 schematically illustrates a power device, such as for example a power transformer, globally indicated by the reference number 10, which is positioned along a power line 20 such as a multi-phase AC power line. The power device 10 has at least one input side 11 through which an input current $I_{in}$ flows into it, and at least and one output side 12 through which an output current $I_{out}$ flows out from it.

The power device 10 is operatively coupled with a differential protection unit 30. For example, the differential protection unit 30 can be part of or constituted by any suitable electronic relay or IED (Intelligent Electronic Device) and comprises a typical characteristic operating curve as that illustrated in FIG. 2. Values above the plotted curve of FIG. 2 indicates that a fault has occurred and would generally cause the protection unit 30 to trip an associated circuit breaker so as to interrupt the flow of current through the power device 10. A first current transformer 13 and a second current transformer 14 are located on the power line 20 on input side 11 and on output side 12, respectively. The power device 10 is illustrated in FIG. 3 as having only two side connections 11 and 12 but, depending on the applications, it may have more than two side connections. For instance, a power bus-bar normally interconnects a plurality of circuits, such as generators, transmission lines, transformers et cetera. In these cases, there might be provided a current transformer on each side of connection of the power device 10.

The current transformers surrounding the power device 10 (in the example of FIG. 3 the two current transformers 13 and 14) delimit the area inside or outside of which an occurring fault would be considered an internal fault or an external fault (also indicated as a "through fault") to the power device 10 itself, respectively. Thus, the current transformers define the zone to be protected and a fault occurring in the zone is an internal fault, while a fault occurring outside the zone is an external or through fault.

Figure 5:
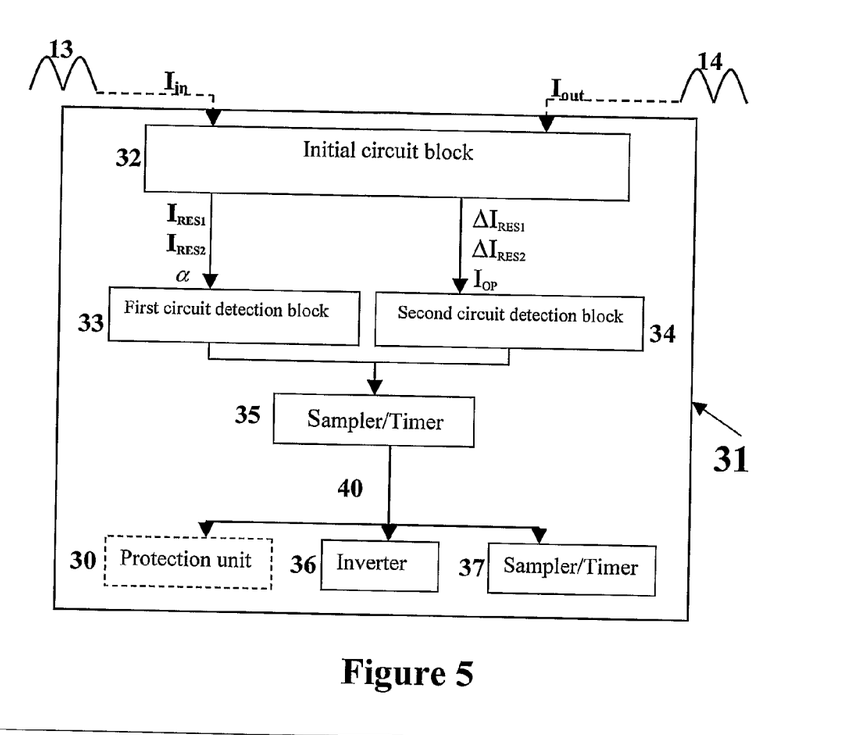
FIG. 5 is an exemplary block diagram schematically representing an electronic circuit used in the method and system according to the present invention.

The two current transformers 13 and 14 reduce the high currents on the power line 20 to an appropriate level for processing by an electronic circuit, schematically indicated in FIG. 5 by the overall reference number 31 which is usually part of the differential protection unit 30.

Outputs from the two current transformers 13 and 14 are inputs to an initial circuit block, schematically indicated in FIG. 5 by the reference number 32.

Figure 4:
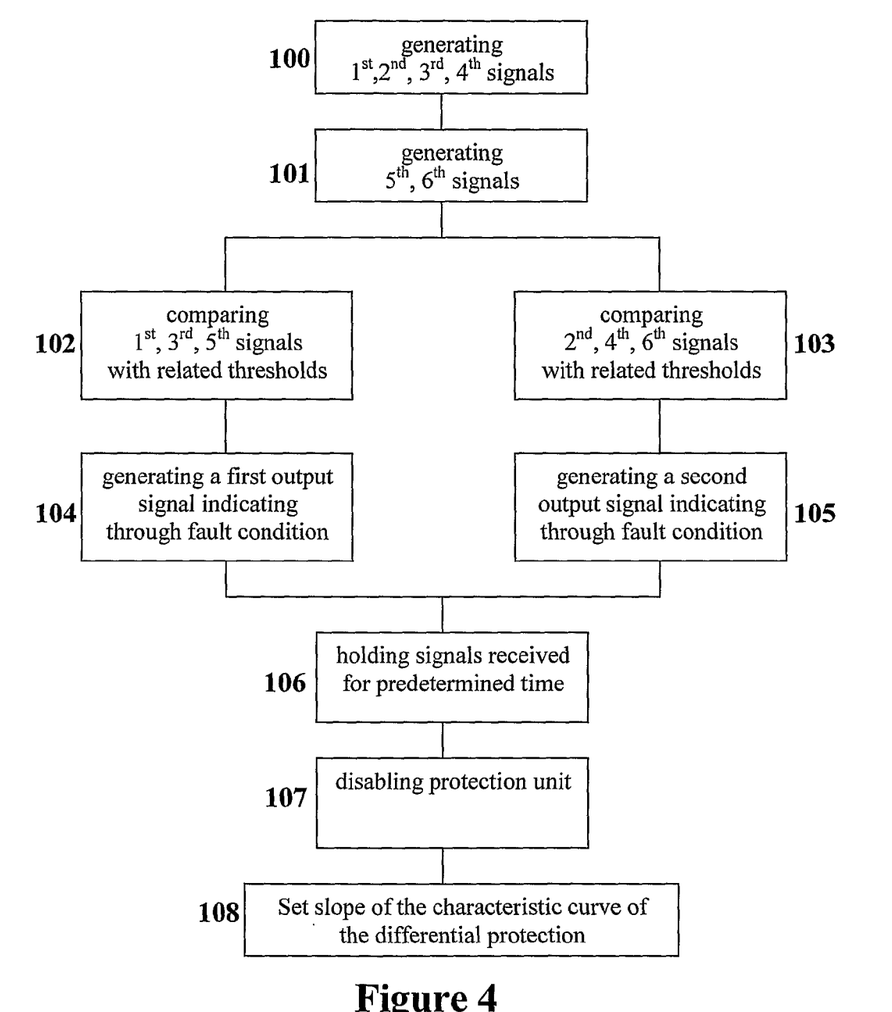
FIG. 4 is an exemplary flow diagram schematically representing an embodiment of the method according to the present invention.

As indicated in FIG. 4, at a step 100 of the method according to the invention, a first signal and a second signal which are each representative of the input current $I_{in}$, and a third signal and a fourth signal which are each representative of the output current $I_{out}$ are generated in the initial circuit block 32. Further, at step 101, the initial circuit block 32 also generates a fifth signal and a sixth signal which are each representative of a relationship between the input current and the output current. The fifth and sixth signals can be representative of a relative relationship between the input and the output currents or can represent a combination of them.

Preferably, the first signal and the second signal each represent a corresponding quantity of the input current $I_{in}$, flowing into the power device 10, the two corresponding quantities being different to each other. Likewise, the third signal and the fourth signal are representative of two corresponding quantities of the output current $I_{out}$ flowing out from the power device 10 and which are different to each other.

Figure 7:
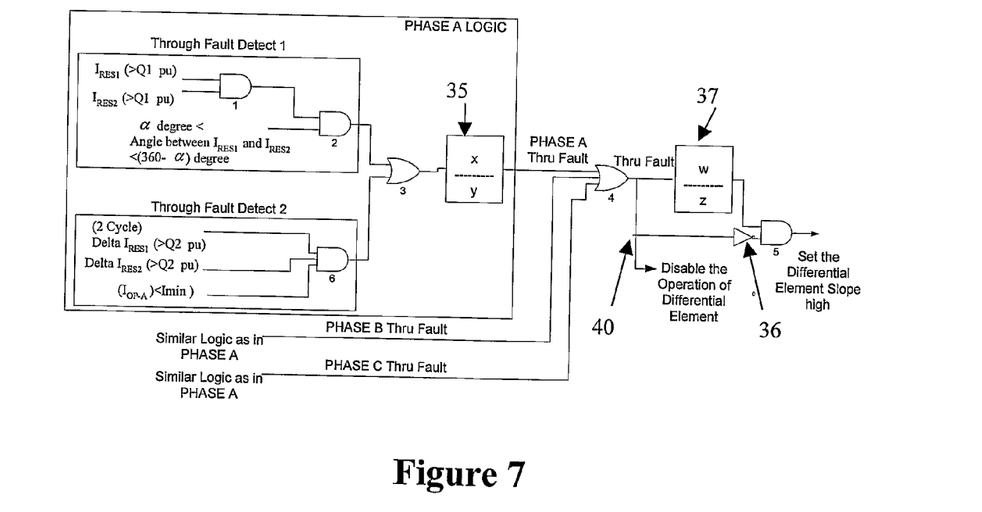
FIG. 7 shows a part of the electronic circuit of FIG. 5 used in the method and system according to the present invention.

In the method and system according to the present invention, the first signal represents the magnitude of the input current $I_{in}$, and in particular, as illustrated in FIG. 7, it represents the magnitude of the so-called restraining current $I_{RES1}$ which is derived from the input current $I_{in}$ itself. In details, $I_{RES1}$ represents the phasor (magnitude and phase angle) of the current flowing into the power device 10 and is provided as an input to the electronic circuit 31. In turn, the third signal represents the magnitude of the output current $I_{out}$, and in particular as indicated in FIG. 7, it represents the magnitude of the so-called restraining current $I_{RES2}$ which is derived from the output current $I_{out}$ itself. Likewise, $I_{RES2}$ represents the phasor (magnitude and phase angle) of the current flowing out from the power device 10 and is also provided as an input to the electronic circuit 31. The second signal and the fourth signal represent, respectively, the change of the magnitude of the input current $I_{in}$ and of the output current $I_{out}$ in a determined period of time. In particular, as indicated in FIG. 7, the second signal and the fourth signal are indicative of the change ($\Delta I_{RES1}$ and $\Delta I_{RES2}$) of magnitude of the respective restraining currents $I_{RES1}$ and $I_{RES2}$, in a determined interval of time, such as for example 2 cycles.

Figure 6:
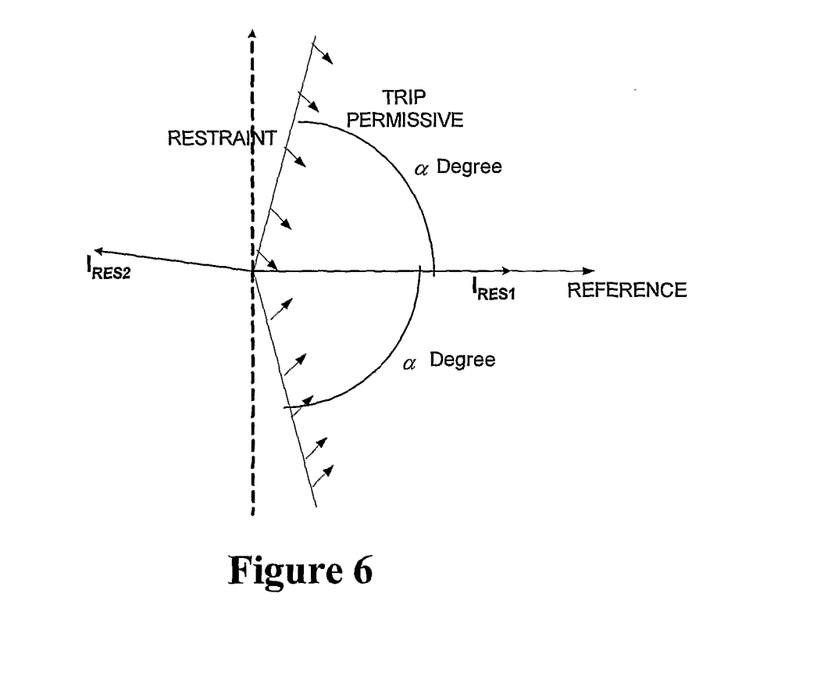
FIG. 6 shows a through fault detection characteristic based on restraint currents phase comparison, used in the method and system according to the present invention.

In turn, the fifth signal is representative of the phase angle $\alpha$ formed between the phasors $I_{RES1}$ and $I_{RES2}$ derived by and representing the input and output currents, with the first current phasor ($I_{RES1}$) which is taken as reference as illustrated in the graph of FIG. 6.

The sixth signal is the magnitude of the operating current $I_{OP}$ obtained by summing the phasors $I_{RES1}$ and $I_{RES2}$ ($I_{OP}=I_{RES1}+I_{RES2}\Psi$).

As schematically illustrated in FIG. 5, the first, third and fifth signals are each sent as an input to a first circuit detection block 33, while the second, fourth and sixth signals are each provided as an input to a second circuit detection block 34.

As shown in FIGS. 4 and 7, the two set of three signals are then initially processed along two separate branches constituted by the circuit blocks 33 and 34. At step 102 the first signal and the third signal are both compared with a first threshold Q1, while the fifth signal is compared with a second threshold, $\alpha$. At the step 103, which is more or less simultaneous with step 102 but is carried out by the other circuit detection block 34, the second signal and the fourth signal are compared with a third threshold Q2, while the sixth signal is compared with a fourth threshold, $I_{min}$.

Preferably, the first threshold Q1 is bigger than the third threshold Q2. In particular, the first threshold is set preferably equal to 1.25 PU (Per Unit System), and the third threshold Q2 is preferably fixed equal to 1 PU, wherein 1 PU is a value fixed equal to the rated current of the power device 10.

In turn, the second threshold is expressed in terms of angular values, and in particular it defines a range comprised between ±α degrees, with α being, as above indicated, the phase angle formed between the second current phasor derived by and representing the output current and the first current phasor derived by and representing the input current which is taken as reference. Preferably, α can have any value between 45° and 135° and is selected by the application requirement based on the compromise between security and dependability. For example, α can be fixed equal to 70°.

Further, the fourth threshold is preferably equal to the magnitude of the prefixed minimum operating current $I_{min}$ of the power device 10.

With reference to FIG. 7, when the first signal and the third signal each exceed the first threshold Q1, corresponding signals are sent as inputs to an AND gate 1. The AND gate 1 outputs a corresponding signal to a second AND gate 2 when both the first and the third signals exceed the first threshold Q1 at the same time. The fifth signal is also processed and if its value falls below the value defined by the second threshold, this condition indicates a possible detected internal fault. Therefore, intervention of the differential protection unit 30 would be permitted so as to interrupt the current flow through the power device 10. If instead the value of the fifth signal exceeds the second threshold, i.e. it is outside the defined range, a corresponding signal is sent at an associated input to the AND gate 2. In practice, as illustrated in FIG. 6, using the $I_{RES1}$ as a reference, $I_{RES2}$ is plotted with respect to $I_{RES1}$. If the $I_{RES2}$ is outside the determined phase angle threshold, a possible through fault condition is determined. In the case of three or more connection sides in the differential protection zone, $I_{RES2}$ will be the phasor sum of all sides except the side of $I_{RES1}$ which is taken as reference.

Hence, when the first and third signals exceed the first threshold and the fifth signal exceeds the second threshold at the same time, the AND gate 2 receives both corresponding signals in input and produces, a first output signal indicative of a potential fault external ("through fault") to the power device 10. This first output signal is sent at step 104 in input to an OR gate 3 which is therefore driven high (or one).

On the other branch circuit 34, when the second signal and the fourth signal each exceed the third threshold Q2, corresponding signals are sent as an input to an AND gate 6. Further, if also the sixth signal exceeds the fourth threshold a corresponding signal is sent as an input to the AND gate 6. As indicated in FIG. 7, this condition is met, i.e. the fourth threshold is exceeded, when the value of operating current $I_{OP}$ is below the value of the minimum operating current $I_{min}$. Hence, when both the second and fourth signals exceed the third threshold Q2 and the sixth signal exceeds the fourth threshold at the same time, the AND gate 6 receives all corresponding signals at an associated input and produces, at step 105, a second output signal indicative of a potential fault external to the power device. This second output signal is also sent as an input to the OR gate 3 driving it high (or one).

When the OR gate 3 receives either the first output signal and/or the second output signal, it sends a corresponding signal as an input to a block 35, which comprises a sampler or pick up/drop out timer. In a step 106, the signal received as an input from the OR gate 3 is held for a predetermined period of time X, X being for example a half cycle. The sampler 35 samples the signal received during the period of time X. If this period of time elapses and the signal at the input is still present, which means that either the first output signal and/or the second output signal indicative of a potential fault external to the power device is present, the block 35 outputs a signal as an input to an OR gate 4, i.e. block 35 drives the input signal of OR gate 4 high (or one).

As illustrated in FIG. 7, the OR gate 4 is connected to and receives likewise the respective signal from, if any, each electrical phase present. Hence, if at least one phase is under this condition of external or through fault, at step 107, the OR gate 4 is driven high (or one) and a disabling signal 40 is output, through it, so as to temporarily disable the differential protection unit 30. The operation of the differential protection unit 30 is therefore disabled to prevent remedial action from taking place when the fault is an external fault and not an internal fault.

Preferably, after the elapse of the output signal from the OR gate 3, the sampler 36 drives high (or one) the OR gate 4 so that the disabling signal 40 is continuously sent to the differential protection unit 30 for a predetermined interval of time Y, Y being for example up to 4 cycles. This ensures that the through fault condition is detected and maintained for long enough time to prevent misoperation of the differential protection unit 30.

Thanks to the method and system of the present invention, the detection of external or through faults is based on several factors, and represents a good compromise between the need of safe operations and that of stability. Further, the solution conceived allows to identify through fault conditions under different operating states. For instance, the second circuit detection block 34 allows to identify an external fault condition occurring in electrical transients, i.e. in fast changing conditions.

In addition, in the method and system according to the present invention, the disabling signal 40, i.e. the signal one or high coming from the OR gate 4 can be fed in input to an inverter 36 and to a block 37 which comprises a second sampler or pick up/drop out timer. The second sampler 37 samples the signal 40 received from the OR gate 4 for a predetermined period of time W, W being for example up to 1 cycle. When this period of time W elapses, and the signal 40 in input high (or one) coming from the OR gate 4 is still present, the sampler 37 outputs a corresponding driving signal as an input to the AND gate 5. After elapsing of the signal high (or one) coming from the OR gate 4, the sampler 37 still feeds a driving signal high (or one) to the AND gate 5 continuously for a predetermined interval of time Z, Z being for example up to 4 cycles. In turn, the inverter 36 inverts the signal received from the OR gate 4. Namely, if the signal produced by the OR gate 4 is level high (or one) i.e. it corresponds to the condition of external or through fault, it converts this signal into a signal of low level (or zero) and sends it as an input to an AND gate 5. While instead, the disabling signal 40 is elapsed, i.e. the output from the OR gate 4 is now level low (or zero), the inverter 36 turns this signal into level high (or one). Therefore, when the AND gate 5 receives both signals high (or one) from inverter 36 and sampler 37, i.e. during the period of time Z, it outputs at step 108, a corresponding command signal towards an additional circuital logic (not shown) of the protection unit 30, so as to modify, and in particular increase the slope of the characteristic operating curve, like the one shown in FIG. 2, of the differential protection unit 30 itself. In this way, the differential protection unit becomes more immune to external or through fault current.

Although the method and system of the present invention have been illustrated with particular regard to their use with power transformers, it should be appreciated that they may be used with any other suitable power device, such as power lines, generators, reactors, bus-bars, etc. Further, one skilled in the art would, from the description given above, appreciate that the construction of the electronic circuit 31 as a whole, and of all its blocks previously described, including the electronic single components and their mutual connection, are readily and easily conceivable without requiring to exercise any inventive activity, and therefore were not described in specific details in the foregoing description.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A method for fault detection analysis in a power device positioned along a power line having one or more phases which is operatively associated with a differential protection unit, said power device having at least one input side and one output side through which an input current flows into the power device and an output current flows out from the power device, respectively, the method comprising for each of said one or more phases of said power line:

generating a first signal and a second signal which are each representative of said input current flowing on said power line for an associated one of said one or more phases of said power line, and a third signal and a fourth signal which are each representative of said output current flowing on said power line for said one or more phases of said power line for which said first and second signals are generated, wherein said first signal and said second signal are constituted by the magnitude of a first current phasor representing said input current and the change of the magnitude of said first current phasor in a determined period of time, respectively, and wherein said third signal and said fourth signal are constituted by the magnitude of a second current phasor representing said output current and the change of magnitude of said second current phasor in a determined period of time, respectively;

generating a fifth signal and a sixth signal which are each representative of a relationship between said input current flowing on said power line for said associated one of said one or more phases of said power line for which said first and second signals are generated and said output current flowing on said power line for said associated one of said one or more phases of said power line for which said first and second signals are generated, wherein said fifth signal is representative of the phase angle α formed between a first current phasor representing said input current and a second current phasor representing said output current, the first current phasor being taken as reference, and wherein said sixth signal represents the magnitude of a phasor obtained by summing a first current phasor representing said input current and a second current phasor representing said output current;

comparing said first signal and said third signal with a first threshold and said fifth signal with a second threshold expressed in terms of angular values, and when said first signal and said third signal exceed said first threshold and said fifth signal exceeds said second threshold at the same time, producing a first output signal indicative of a potential fault external for said associated one of said one or more phases of said power line for which said first and second signals are generated to the power device;

comparing said second signal and said fourth signal with a third threshold and said sixth signal with a fourth threshold, and when said second signal and said fourth signal exceed said third threshold and said sixth signal exceeds said fourth threshold at the same time, producing a second output signal indicative of a potential fault for said associated one of said one or more phases of said power line for which said first and second signals are generated external to the power device; and when at least one of said first output signal for said associated one of said one or more phases of said power line for which said first and second signals are generated and said second output signal associated with said first output signal indicative of a potential fault external to the power device is still present after a predetermined period of time is elapsed, generating a disabling signal for said associated one of said one or more phases of said power line for which said first and second signals are generated so as to temporarily disable said differential protection unit.

2. A method for fault detection analysis as in claim 1, wherein said first signal and said second signal are representative of two corresponding different quantities of said input current flowing into the power device.

3. A method for fault detection analysis as in claim 1, wherein said third signal and said fourth signal are representative of two corresponding different quantities of said output current flowing out from said power device.

4. A method for fault detection analysis as in claim 1, wherein said second threshold is comprised between ±~ degrees, with ~ being comprised between 45° and 135°.

5. A method for fault detection analysis as in claim 1, wherein it comprises sampling said first output signal or said second output signal indicative of a potential fault external to the power device during said predetermined period of time.

6. A method for fault detection analysis as in claim 1, wherein said disabling signal is generated continuously for a predetermined interval of time.

7. A method for fault detection analysis as in claim 1, wherein said first threshold is bigger than said third threshold.

8. A method for fault detection analysis as in claim 1, wherein said first threshold is equal to 1.25 PU, 1 PU being equal to the rated current of the power device.

9. A method for fault detection analysis as in claim 1, wherein said third threshold is equal to 1 PU, 1 PU being equal to the rated current of the power device.

10. A method for fault detection analysis as in claim 1, wherein said fourth threshold is equal to a prefixed minimum operating current of said power device.

11. A method for fault detection analysis as in claim 1, further comprising sampling said disabling signal for first a predetermined amount of time.

12. A method for fault detection analysis as in claim 11, further comprising generating a driving signal for a second predetermined amount of time after said disabling signal becomes absent.

13. A method for fault detection analysis as in claim 12, wherein said differential protection unit comprises a characteristic operating curve, and a command signal is generated during said second predetermined amount of time so as to modify the slope of said characteristic operating curve.

14. A system for fault detection analysis in a power device positioned along a power line having one or more phases and having at least one input side and one output side through which an input current flows into the device and an output current flows out from the device, respectively, comprising for each of said one or more phases of said power line:

a differential protection unit which is operatively associated with said power device;

means for generating a first signal and a second signal which are each representative of said input current flowing on said power line for an associated one of said one or more phases of said power line, a third signal and a fourth signal which are each representative of said output current flowing on said power line for said associated one or more phases of said power line for which said first and second signals are generated, a fifth signal and a sixth signal which are each representative of a relationship between said input current and said output current flowing on said power line for said associated one or more phases of said power line for which said first and second signals are generated, wherein said first signal and said second signal are constituted by the magnitude of a first current phasor representing said input current and the change of the magnitude of said first current phasor in a determined period of time, respectively, wherein said third signal and said fourth signal are constituted by the magnitude of a second current phasor representing said output current and the change of magnitude of said second current phasor in a determined period of time, respectively, wherein said fifth signal is representative of the phase angle α formed between a first current phasor representing said input current and a second current phasor representing said output current, the first current phasor being taken as reference, and wherein said sixth signal represents the magnitude of a phasor obtained by summing a first current phasor representing said input current and a second current phasor representing said output current;

first comparing means for comparing said first signal and said third signal with a first threshold;

second comparing means for comparing said fifth signal with a second threshold expressed in terms of angular values;

third comparing means for comparing said second signal and said fourth signal with a third threshold;

fourth comparing means for comparing said sixth signal with a fourth threshold;

means for producing for said associated one of said one or more phases of said power line for which said first and second signals are generated a first output signal indicative of a potential fault external to the power device when said first signal and said third signal exceed said first threshold and said fifth signal exceeds said second threshold at the same time, or a second output signal indicative of a potential fault external to the power device when said second signal and said fourth signal exceed said third threshold and said sixth signal exceeds said fourth threshold at the same time; and means for generating for said associated one of said one or more phases of said power line for which said first and second signals are generated a signal temporarily disabling the differential protection unit when at least one of said first output signal and said second output signal indicative of a potential fault external to the power device is still present after a predetermined period of time is elapsed.

15. A system as in claim 14, wherein said differential protection unit comprises a characteristic operating curve, and the system further comprises means for generating a command signal so as to modify the slope of said characteristic operating curve for a pre-determined amount of time when said disabling signal becomes absent.

* * * * *